United States Patent
Hill (10) Patent No.: US 12,334,416 B2
(45) Date of Patent: Jun. 17, 2025

(54) THROUGH SUBSTRATE VIA (TSV) VALIDATION STRUCTURE FOR AN INTEGRATED CIRCUIT AND METHOD TO FORM THE TSV VALIDATION STRUCTURE

(71) Applicant: NXP USA, Inc., Austin, TX (US)

(72) Inventor: Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/489,915

(22) Filed: Oct. 19, 2023

(65) Prior Publication Data
US 2024/0047309 A1  Feb. 8, 2024

Related U.S. Application Data

(62) Division of application No. 17/351,440, filed on Jun. 18, 2021, now Pat. No. 11,823,978.

(51) Int. Cl.
| | |
|---|---|
| *H01L 23/48* | (2006.01) |
| *G01R 27/02* | (2006.01) |
| *H01L 21/66* | (2006.01) |
| *H01L 21/768* | (2006.01) |
| *H01L 23/528* | (2006.01) |
| *H10D 30/47* | (2025.01) |
| *H10D 62/85* | (2025.01) |
| *H10D 64/00* | (2025.01) |
| *H10D 64/23* | (2025.01) |

(52) U.S. Cl.
CPC ........... *H01L 23/481* (2013.01); *G01R 27/02* (2013.01); *H01L 21/76898* (2013.01); *H01L 22/14* (2013.01); *H01L 23/5286* (2013.01); *H10D 30/475* (2025.01); *H10D 62/8503* (2025.01)

(58) Field of Classification Search
CPC . H01L 23/481; H01L 21/76898; H01L 22/14; H01L 23/5286; H01L 29/2003; H01L 29/7786; H01L 29/41758; H01L 29/4175; H01L 29/402; G01R 27/02; G01R 31/2853; G01R 31/2856
See application file for complete search history.

(56) References Cited

U.S. PATENT DOCUMENTS

2020/0235091 A1* 7/2020 Kang ................ H01L 23/5225

* cited by examiner

*Primary Examiner* — Herve-Louis Y Assouman (57) ABSTRACT

An integrated circuit comprises a substrate that includes a first surface and a second surface. A first through substrate via (TSV) is formed between the first surface and the second surface and a first conductive material is arranged within the first TSV to form a conductive path between the first surface and the second surface through the substrate. A second TSV is formed between the first surface and the second surface and a second conductive material arranged within the second TSV to form a conductive path between the first surface and the second surface through the substrate. In examples the first TSV has a larger cross-sectional area than the second TSV, the cross-section of the first TSV and second TSV being in a plane parallel to the first surface or the second surface.

7 Claims, 6 Drawing Sheets

FIG. 8

THROUGH SUBSTRATE VIA (TSV) VALIDATION STRUCTURE FOR AN INTEGRATED CIRCUIT AND METHOD TO FORM THE TSV VALIDATION STRUCTURE

CROSS-REFERENCE TO RELATED APPLICATIONS

This application claims the priority under 35 U.S.C. § 120 to U.S. patent application Ser. No. 17/351,440, filed on 18 Jun. 2021, the contents of which are incorporated by reference herein in its entirety.

TECHNICAL FIELD

Embodiments of the subject matter described herein relate generally to integrated circuits, including a through substrate via (TSV) validation structure for an integrated circuit and method to form the TSV validation structure.

BACKGROUND

Integrated circuits find application in a wide variety of electronic components and systems. Radio frequency (RF), microwave, and millimeter wave applications employ through substrate vias (TSV) for electrical connections from a first side of a substrate of the integrated circuit to a second side of the substrate. Gallium nitride (GaN) devices on silicon carbide (SiC) substrates allow high frequency and high power operation. However, SiC is difficult and time-consuming to etch, and in some cases, SiC etches may lead to over-etching or under-etching of the substrate.

BRIEF DESCRIPTION OF THE DRAWINGS

A complete understanding of the subject matter may be derived by referring to the detailed description and claims when considered in conjunction with the following figures, wherein like reference numbers refer to similar elements throughout the figures.

DETAILED DESCRIPTION

A through substrate via (TSV) is formed in a substrate by an etching process where a lithographic mask is formed on a first surface such as a lower surface of the substrate and the substrate is etched by an etching material from the first surface to a second surface such as an upper surface of the substrate. The mask may have patterns of a plurality of openings of a same size so that the etching material of the etching process etches the substrate for a period of time long enough at the openings to form TSVs. An etch rate is defined as a rate by which a depth of a hole in the substrate increases as a function of time and typically depends on how deep the hole is and a size of an opening.

Ideally, the etching process forms a plurality of TSVs on the substrate for a plurality of openings of the mask. But in practice, some TSVs are not properly formed. The etching material is not able to etch from the first surface to the second surface at all areas of the substrate because of varying thickness of the substrate or contamination of the etching material.

A transistor such as a field effect transistor has a drain finger, gate finger, and source finger typically formed at or below the second surface and at least one TSV electrically connects the source finger to the second surface which is at a reference potential such as ground. In examples, formation of the TSV needs to be properly validated. A DC (direct current) test is one example for validating formation of a TSV. The DC test involves applying a DC voltage to a drain finger of a transistor, applying a varying voltage to a gate finger of the transistor, and measuring current from the drain to the ground. If a source finger of the transistor is connected to one TSV, then the DC test will validate an individual TSV. If the source finger is connected to a plurality of TSVs, then the DC test cannot validate the plurality of TSVs. The DC test will only validate that at least one TSV connects the source finger to the ground and is not be able to detect whether more than one TSV provides a path for current to flow from the source finger to the ground.

Embodiments are disclosed herein for validating that a standard TSV (e.g., a TSV with a specific configuration that connects a source finger to ground) provides an electrical connection from the first surface of the substrate to the second surface of the substrate based on formation of a non-standard TSV (i.e., a TSV that has a configuration that is different from the configuration of a standard TSV). The standard TSV may be a TSV associated with providing an electrical connection from the first surface of the substrate through the substrate to the second surface of the substrate. The non-standard TSV is an undersized TSV compared to the standard TSV. Both the standard TSV and non-standard TSV are formed by an etching process. Since an etch rate depends on the size of the opening in the mask, if a non-standard opening in the mask to form the non-standard TSV is smaller than a standard opening in the mask to form the standard TSV, then the etch rate will be lower for the non-standard opening compared to the standard opening. The size of the non-standard opening and duration of the etching is chosen based on empirical testing so if the non-standard TSV is formed then the standard TSV is likely also formed because the standard opening of the standard TSV is larger and has a faster etch rate than the non-standard opening of the non-standard TSV. A conductive material is then arranged within the standard opening to form a conductive path between the first surface to the second surface. Similarly, a conductive material is arranged within the non-standard opening to form a conductive path between the first surface to the second surface.

A test process validates formation of the standard TSV based on validating formation of the non-standard TSV. The test comprises electrically connecting at the first surface of the substrate a first probe to conductive material and electrically connecting a second probe to a pad at the first surface which is electrically connected to the second surface. The conductive material may be formed as a result of etching the substrate at an opening of a mask to attempt to form a non-standard TSV followed by deposition of the conductive material in the etched substrate. Further, a voltage source is electrically connected to the conductive material. A conductivity is measured from the first probe to the second probe and a determination is made whether the conductivity meets a threshold amount. If the conductivity meets the threshold amount, then the pad forms an electrical connection to the second surface, a non-standard TSV is formed, and formation of a standard TSV in proximity to the non-standard TSV is validated. If the conductivity does not meet the threshold amount, then a non-standard TSV is not formed and formation of a standard TSV in proximity to the non-standard TSV is not validated. The conductivity may be characterized by a current. In other examples, the voltage source is not connected to the conductive material and instead a resistance between the first probe and second probe is measured. If the resistance meets a threshold amount, then the non-standard TSV is formed and provides a level of confidence that the standard TSVs proximate to the non-standard TSV are properly formed. If the resistance does not meet a threshold amount, then the substrate 152 must not have etched all the way through and the non-standard TSV and standard TSV were assumed not to be properly formed.

Figure 1:
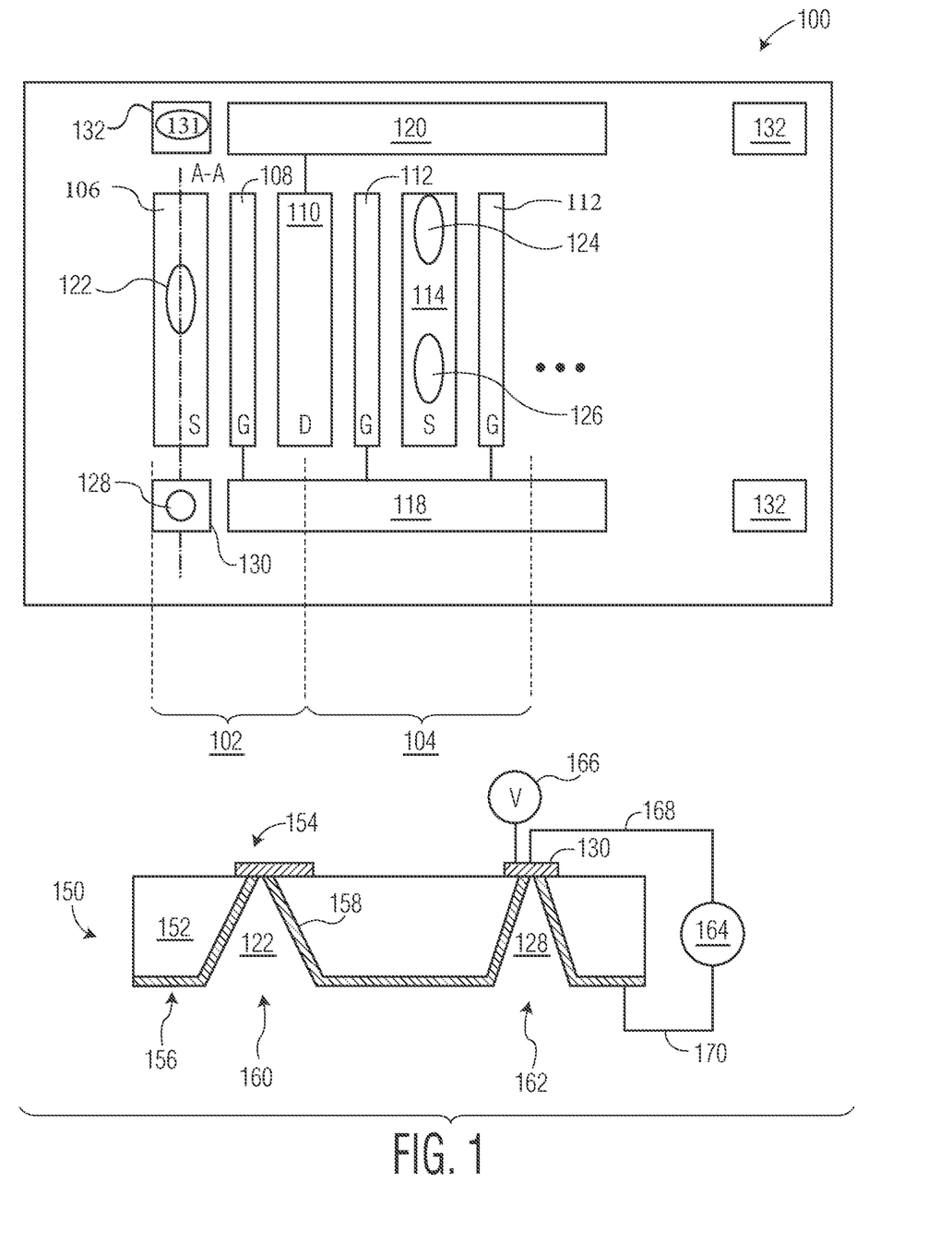
FIG. 1 is an example top view and cross section view of an example integrated circuit according to an embodiment.

FIG. 1 is an example top view 100 and cross section view 150 of an example integrated circuit in accordance with an embodiment. The cross section view 150 may be along line A-A in the top view 100. The integrated circuit may include a substrate 152 composed of a semiconductor material such as silicon carbide (SiC) or other suitable semiconductor materials, as described below. Substrate 152 may have a first surface 154 and a second surface 156.

The first surface 154 may have an active semiconductor device such as a transistor 102. The transistor 102 may be a gallium nitride (GaN) field effect transistor (FET) defined by a plurality of fingers such as a source finger 106 ("S"), a gate finger 108 ("G"), and a drain finger 110 ("D"). The drain finger 110 of a transistor 102 may be coupled to an output bond pad 120, the gate finger 108 of the transistor may be coupled to an input bond pad 118, and the source finger 106 of the transistor may be electrically connected to a reference potential (herein "ground"). In other examples, the first surface 154 may have other active devices than a transistor 102.

In examples, the second surface 156 of the integrated circuit may be arranged at the reference potential such as ground and the source finger 106 may be coupled to the reference potential by a through substrate via (TSV) 122. The TSV 122 may be a hole in the substrate 152 which is arranged with a conductive material such as gold to provide the electrical connection from the source finger 106 to the second surface 156. In an example, an interior surface of the substrate 152 at the TSV 122 may be lined with the conductive material or the TSV 122 is filled with the conductive material to provide the electrical connection.

In some examples, the first surface 154 may have a conductive ground pad 132 to facilitate grounding the second surface 156 (i.e., electrically connecting the second surface 156 to a ground potential) or providing an electrical connection from the first surface 154 to the second surface 156. The ground pad 132 may be electrically connected to the second surface 156 by a TSV 131 (shown in not all ground pads 132) to ground the second surface 156. Further, the ground pad 132 may be directly electrically connected to circuitry on the first surface 154 such as a source finger 106 by a conductive trace on the first surface 154 which in turn is electrically connected to the second surface 156 by the TSV 131. A grounded probe needle placed on the ground pad 132 will ground the second surface 156 by the TSV 131 instead of the second surface 156 being directly coupled to ground. Further, the first surface 154 may be arranged with a plurality of ground pads 132 similarly connected to the second surface 156 to provide redundancy in grounding the second surface 156 in case a grounded probe needle positioned on a ground pad 132 is damaged and does not ground the second surface 156. In other examples, a reference voltage other than ground may be provided to the ground pad 132 to place the second surface 156 to the reference voltage (in which case the ground pad may be generally referred to as a reference pad).

The TSV is formed by an etching process where a lithographic mask is formed on the second surface 156. The mask may be pattered to have a plurality of openings of a same size (i.e., same area) so that an etching material of the etching process etches the substrate 152 for a period of time long enough at the openings to form TSVs. An etch rate is defined as a rate by which a depth of a hole in the substrate 152 increases as a function of time and typically depends on how deep the hole is and a size of an opening ("aspect ratio"). Further, the etch rate tends to slow down as the hole becomes deeper. Ideally, the etching process may form a plurality of TSVs through the substrate 152 for a plurality of openings of the mask. But in practice, some TSVs may not be formed because the etching material is not able to etch from the second surface 156 to the first surface 154 at all areas of the substrate 152. For example, the substrate 152 may be etched through the substrate 152 at some openings to form TSVs while the substrate 152 may not be etched though at other openings because one portion of the substrate 152 is thicker than a rest of the substrate 152 to not form a TSV, i.e., TSV are properly formed in the thinner portions but not properly formed in the thicker portions of the substrate 152. As another example, a contamination of the etching material in one area of a substrate 152 may slow down an etch rate in the one area resulting in the TSV not being formed in those areas with an opening. In this example, TSVs are not formed in all areas of the substrate 152 with the opening because the substrate 152 is not etched all the way through.

In examples, formation of a TSV needs to be properly validated. A DC (direct current) test is one example for validating formation of a TSV when a transistor is formed in or on the substrate 152. The DC test involves applying a DC voltage to a drain finger of a transistor via the output pad 120, applying a varying voltage to the gate finger of the transistor via the input pad 118, and measuring current from the drain finger of the transistor to the ground. If a current from the drain finger of the transistor to the ground exceeds a threshold level for a certain gate voltage, then the DC test will validate that the TSV electrically connects the source finger of the transistor to ground. If a current from the drain finger of the transistor to the ground does not exceeds a threshold level for a certain gate voltage, then the DC test will not validate that the TSV electrically connects the source finger of the transistor to ground.

If a source finger of the transistor is connected to one TSV, then the DC test will validate an individual TSV. If the source finger of the transistor is connected to a plurality of TSVs, then the DC test cannot validate the plurality of TSVs. The DC test will only validate that at least one TSV connects the source finger of the transistor to the ground and not be able to detect whether more than one TSV provides a path for current to flow from the source finger of the transistor to the ground.

For example, the integrated circuit may be a radio frequency (RF) power amplifier and have one or more additional transistors, an example of which is shown as transistor 104 on the first surface 154 arranged in parallel with transistor 102 to amplify analog signals. The transistor 104 may have the drain finger 110 shared with the transistor 102, a gate finger 112, and a source finger 114. Further, the source finger 114 of the transistor 104 may be connected to more than one TSV at different spatial locations of the source finger 114 such as a pair of TSVs 124, 126 so that one or more portions of a same source finger 114 has a shorter distance connection to the electrical ground compared to the source finger 106 being connected to one TSV. Each TSV may be arranged to provide a path to ground for current in a portion of the source finger 114 to improve performance of the transistor 104 at RF frequencies. The integrated circuit will likely pass the DC test even if only one of TSV 124 or TSV 126 connects the source finger 114 to ground. A problem in a connection to ground will only be detected when the integrated circuit is packaged with other integrated circuit to form a product such as an RF amplifier and the RF amplifier is tested at the RF frequencies. The RF amplifier may fail the test at the RF frequencies.

Embodiments are disclosed herein for validating that a standard TSV such as TSVs 122, 124, 126, 131 provides an electrical connection from the first surface 154 of the substrate 152 to the second surface 156 of the substrate 152 based on formation of a non-standard TSV 128. A standard TSV may be a TSV associated with providing an electrical connection from the first surface 154 of the substrate 152 through the substrate 152 to the second surface 156 of the substrate 152. The non-standard TSV is an undersized TSV compared to the standard TSV to be formed in the substrate 152. In examples, the non-standard TSV 128 might not be electrically connected by an interconnect metal (e.g., trace) on the first surface 112 to other semiconductor devices on the first surface 112. In some examples, the non-standard TSV 128 may be located at a periphery of the substrate 152. The periphery may be outside of any active region of a semiconductor device or not within circuitry of the semiconductor device to facilitate subsequent testing as described below. As described below, the non-standard TSV 128 may be formed by mask with an area of an opening in a mask to form the non-standard TSV 128 which is a smaller than an area of an opening in the mask to form the standard TSV 122, 124, 126, 131.

To form the TSVs, a mask is positioned on the second surface 156 of the substrate 152 and the mask is patterned with a non-standard opening 162 to form the non-standard TSV 128 and a standard opening 160 to form a standard TSV 122 and the substrate 152 is etched through the openings in the mask. In an example, the standard opening 160 and the non-standard opening 162 may be used to form vias with respective elliptical and circular cross-sections. In examples, the cross-section of the via may be with respect to a plane parallel to the surface 154 or the surface 156. Further, an area of the standard opening 160 in the mask is larger than the area of the non-standard opening 162 in the mask. In various embodiments, the standard 122 and non-standard TSVs 128 may have the same shape (but different cross-section areas or aspect ratios) or different shapes (and different cross-section areas or aspect ratios). In an example, the cross-sectional area or aspect ratio of the standard and non-standard TSV may be substantially different by 5% or 10%. As used herein, and according to one embodiment, the term "larger than", in the context of the relative differences in sizes or areas of mask openings (or the cross-sectional areas of TSVs at a surface), means that the size or area of one mask opening or cross-sectional area of a TSV (e.g., associated with a standard TSV) is between 10 percent and 20 percent larger than the size or area of another mask opening or cross-sectional area of a TSV (e.g., associated with a non-standard TSV). According to another embodiment, the term "larger than", in the context of the relative differences in sizes or areas of mask openings (or the cross-sectional areas of TSVs), means that the size or area of one mask opening or cross-sectional area of a TSV (e.g., associated with a standard TSV) is between 20 percent and 30 percent (or more) larger than the size or area of another mask opening or cross-sectional area of a TSV (e.g., associated with a non-standard TSV). Non-standard TSV 128 formed through a non-standard opening 162 and TSV 122 formed through a standard TSV opening 160 are formed based on an etching associated with a lithographic process. An etch rate may define a depth by which a hole is etched in the substrate 152 per unit time. Since an etch rate depends on the size or area of the opening in the mask through which the etchant material is applied to the substrate 152, if the non-standard opening 162 has a smaller area than the area of the standard opening 160, then the etch rate will be slower for the non-standard opening 162 compared to the standard opening 160, all other things being equal. The size or area of the non-standard opening 162 and duration of the etching may be chosen based on empirical testing so if the non-standard TSV 128 is formed then the standard TSV 122 is likely also formed because the standard opening 160 through which the standard TSV 122 is formed has a larger area and has a faster etch rate.

After the etching, the etched substrate within an interior of the TSVs 122, 128 are arranged with a conductive material 158. For example, an interior surface of the TSVs 122, 128 are lined with a conductive material as shown or filled with the conductive material 158. A test process is performed to validate whether the non-standard TSV 128 is properly formed. The validation comprises determining the conductivity of the conductive material from the first surface 156 to the second surface 154. In examples, an electrical path may be formed from a conductive pad 130 through the conductive material 158 and to the second surface 156 for a properly formed non-standard TSV 128. In one example, the test process comprises applying a voltage 166 (e.g., DC voltage) to the pad 130, electrically connecting a first probe 168 of a test equipment 164 to the pad 130, and electrically connecting a second probe 170 of the test equipment 164 to the second surface 156. The probe 170 may be directly electrically connected to the second surface 156 as shown or electrically connected to the ground pad 132 on the first surface 154. The test equipment 164 measures current from the pad 130 on the first surface 154 to the second surface 156 (e.g., conductivity). If the current meets a threshold amount, then the non-standard TSV 128 is formed and provides a level of confidence that the TSVs 122, 124, 126, 131 around or proximate to the non-standard TSV 128 which were formed through a larger size mask opening (and thus have larger areas) are properly formed. The TSVs 122, 124, 126, 131 may be proximate to the non-standard TSV 128 if they were formed in a same etching process. If the current does not meet a threshold amount, then the substrate 152 must not have etched all the way through and the non-standard TSV 128 and standard TSV 122, 124, 126, 131 are assumed not to have been properly formed. In another example, the test process comprises not applying the voltage 166 as shown and instead measuring a resistance between the probes 168, 170. If the resistance meets a threshold amount (i.e., the resistance is negligible), then the non-standard TSV 128 is properly formed and provides a level of confidence that the TSVs 122, 124, 126, 131 around or proximate to the non-standard TSV 128 which were formed through larger size mask openings (and thus have larger areas) are properly formed. The TSVs 122, 124, 126, 131 may be proximate to the non-standard TSV 128 if they were formed in a same etching process. If the resistance does not meet a threshold amount, then the substrate 152 might not have etched all the way through and the non-standard TSV 128 and standard TSV 122, 124, 126, 131 are assumed not to have been properly formed.

In examples, the determination of the proper formation of the standard TSV based on testing the non-standard TSV reliability indicates whether the standard TSVs is properly formed without having to perform a test on the standard TSV itself. Further, the example embodiments described above are not limited to a standard TSV being electrically connected to an active semiconductor device such as the transistor 102. In some examples, a standard TSV may be electrically connected to a passive semiconductor device on a surface the substrate 152 rather than the active semiconductor device. In other examples, the substrate 152 may not have any semiconductor devices 152 and instead be arranged as an interposer or bridge which forms electrical connections with other semiconductor chips stacked with the interposer via a standard TSV. The standard TSV associated with the passive semiconductor device, interposer, or bridge may be validated by the testing of the non-standard TSV formed and described herein.

Figure 2:
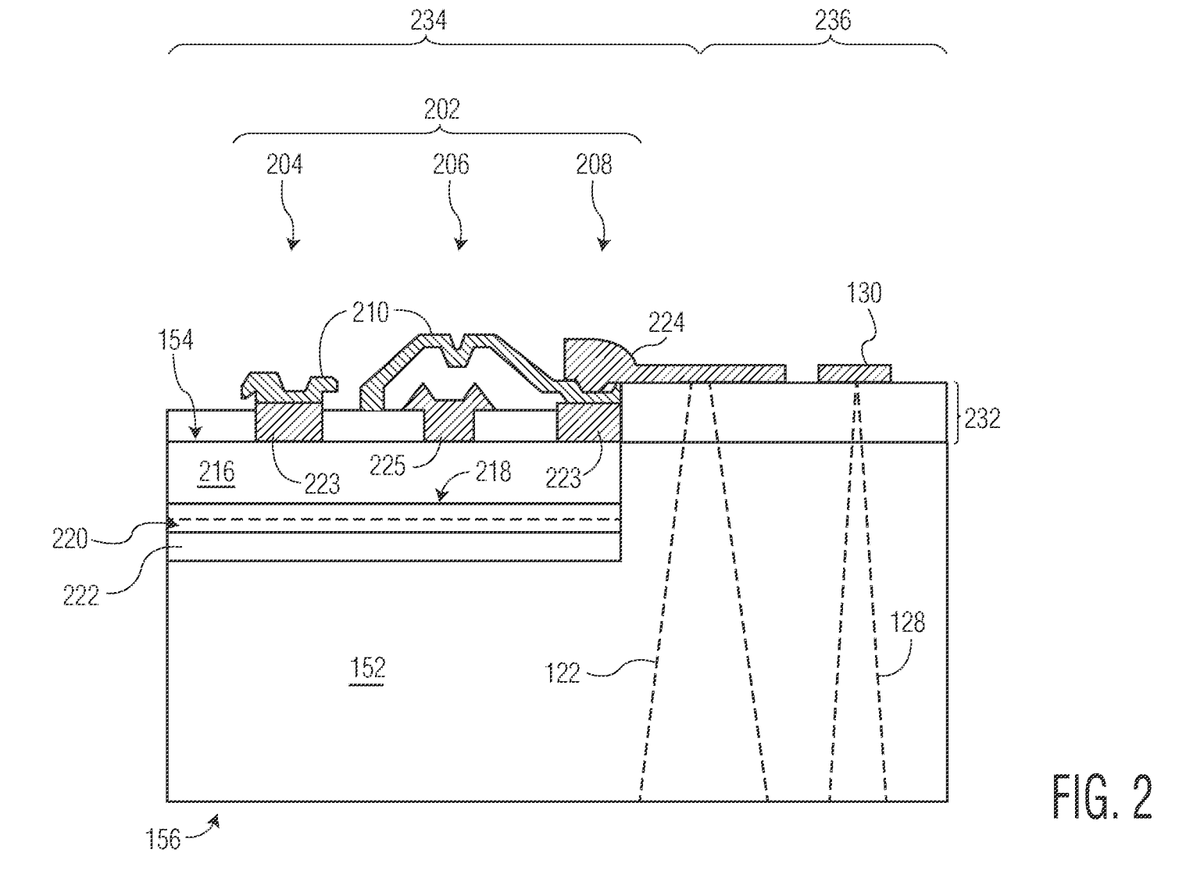
FIG. 2 is an example cross section view of the example integrated circuit in more detail according to an embodiment.

FIG. 2 is an example cross section view of the example integrated circuit 100 in more detail in accordance with an embodiment. The integrated circuit 100 may include a substrate 152 that includes an first surface 154 and a second surface 156 with a semiconductor device in the form of one or more transistors within an active region 234 formed proximate to the first surface 154 of the substrate 152 having layers that support transistor operation. A transistor 202 formed in the active region 234 may include a source electrode 208 of a source finger and a drain electrode 204 of a drain finger. In an integrated circuit, a gate electrode 206 of a gate finger may be formed over the substrate 152 between the source electrode 208 and the drain electrode 204. In examples, the transistor may be a GaN field effect transistor (FET). The device may include one or more transistors or other devices within the active region 234 formed proximate to the first surface 154 of the substrate 152.

In an embodiment, the substrate 152 may include a plurality of group III-N semiconductor layers such as a buffer layer 222, a channel layer 218, a channel 220, and a barrier layer 216 associated with semiconductor device operation. In an embodiment, the substrate 152 may be formed from silicon carbide (SiC). In other embodiments, the substrate 252 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials. In an example, the source electrode 208 and the drain electrode 204 (first and second current-carrying electrodes) may be formed by connections through first and second interconnect metal 210 and 224 to ohmic contacts 223 electrically connected to the substrate 152. Further, a gate electrode 206 may be formed over the substrate 152 and coupled to the active region 234 by a gate contact 225 between the source electrode 204 and the drain electrode 208. In an embodiment, the first interconnect metal 210 may extend over the gate contact 225 to form a field plate.

In an example, an insulating layer 232 may be formed over the substrate 152 and may include one or more dielectric layers. In an embodiment, the insulating layer 232 may also include an etch stop layer. As used herein, an "etch stop layer" refers to a material layer that has selectivity to an etchant material used to etch the substrate 152.

In an example, a standard TSV 122 may be formed within the substrate 152 within a non-active region 236. Similarly, a non-standard TSV 128 may also be formed within the substrate 152 which provides an electrical connection between a pad 130 and a second surface 156 of the substrate 152. The standard TSV 122 and the non-standard TSV 128 are shown as dotted lines to indicate that they have not been formed yet in the substrate 152 and may be formed by an etching process as described in more detail by FIGS. 4-6 below. Then, formation of the non-standard TSV may be validated by test process such that a validated non-standard TSV implies that the standard TSV is also properly formed. In an example when the semiconductor device is a transistor, the conductive material formed within the standard TSV 122 may provide an electrical connection between the second interconnect metal 224 and a second surface 156 of the substrate 152. The second interconnect metal 224 may be a finger of the transistor or generally a conductive element electrically coupled to a semiconductor device 202.

Figure 3:
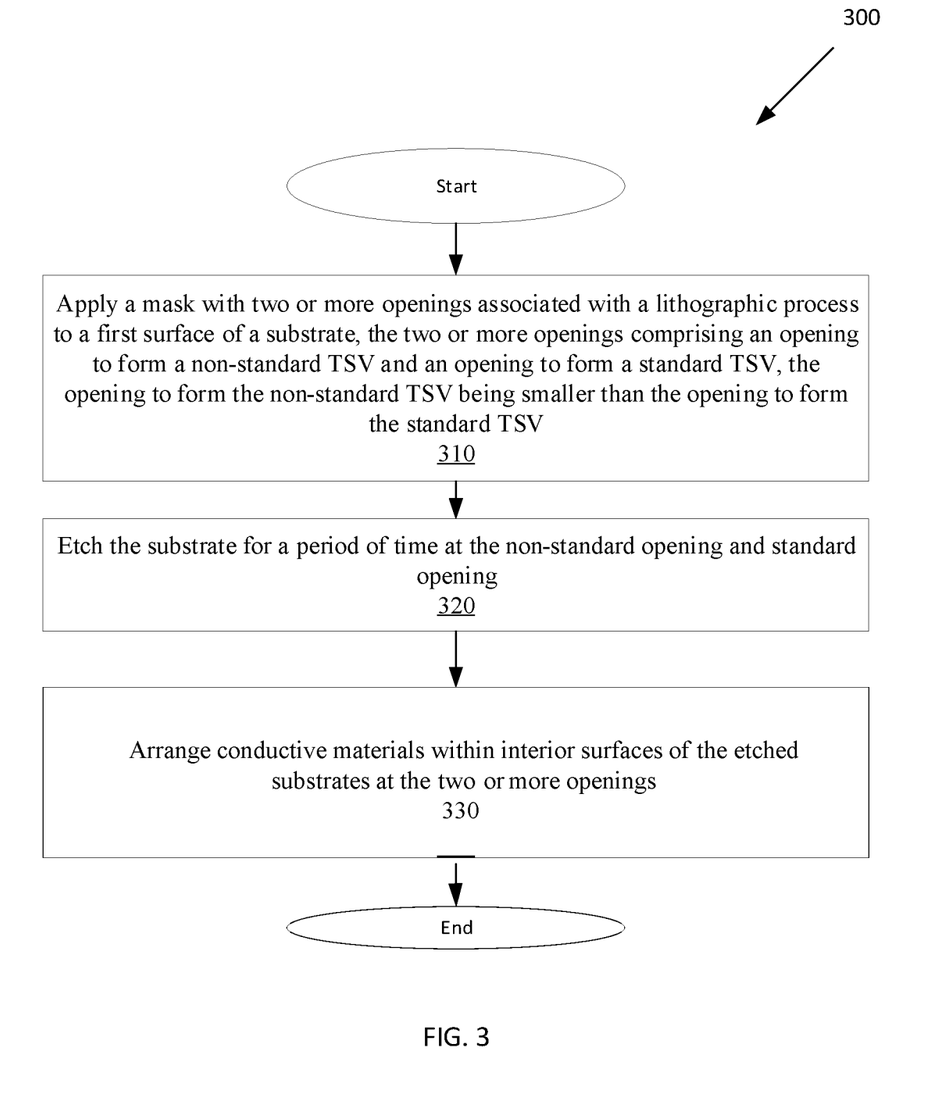
FIG. 3 is an example simplified flowchart depicting an example method of fabricating the example integrated circuit to validate formation of a standard through substrate via (TSV) based on validating formation of a non-standard TSV according to an embodiment.

FIG. 3 is an example simplified flowchart 300 depicting an example method of fabricating the example integrated circuit to validate formation of a standard TSV based on validating formation of a non-standard TSV according to an embodiment. The method for fabrication begins at step 310 where a mask associated with a lithographic process is applied to a first surface of a substrate, the mask is patterned to include two or more openings, the two or more openings comprising an opening to form a non-standard TSV and an opening to form a standard TSV, the opening to form the non-standard TSV being smaller in area than the opening to form the standard TSV. The mask may include aluminum (Al), nickel (Ni), chromium (Cr), photo-resist, indium tin oxide (ITO) or other suitable materials. In some examples, the substrate may have a semiconductor device or be an interposer or bridge. At 320, the substrate is etched for a period of time through the non-standard opening and standard opening. The etching may include a plasma etching technique and performed in one or more steps such that after the time the etching may be complete and openings may ideally extend through the substrate to form TSVs. In examples, the time to etch at the non-standard opening and standard opening may be the same. After removing the mask at 330, conductive materials are arranged within interior surfaces of the etched substrate (i.e., within interior surfaces of the TSVs formed through the openings). The conductive materials may line the interior surface of the TSV or fill the TSV. In an example, a first conductive material is arranged to form an electrical connection from a second surface, through the standard TSV, to a first surface of the substrate, and to the second interconnect metal on the first surface. In an example, a second conductive material is arranged to form an electrical connection from the second surface, though the non-standard TSV to the first surface, and to a pad on the first surface. In an embodiment, the conductive material may be selected from one of gold (Au), nickel (Ni), platinum (Pt), aluminum (Al), copper (Cu), titanium (Ti), silver (Ag), chromium, (Cr), or a combination of these. In an embodiment, the conductive material may be deposited using one or more of sputtering, evaporation, electro-plating, electro-less plating, or other suitable technique(s). Formation of a non-standard TSV may then be validated to validate formation of a standard TSV according to an embodiment.

In examples, the first surface may be a lower surface of the substrate and the second surface may be an upper surface of the substrate. The semiconductor device may be on the upper surface and the substrate is etched from the lower surface to the upper surface. In other examples, the first surface may be an upper surface of the substrate and the second surface may be an lower surface of the substrate. The semiconductor device may be on the upper surface and the TSV may be etched from the upper surface to the lower surface. Other variations are also possible.

Figure 4:
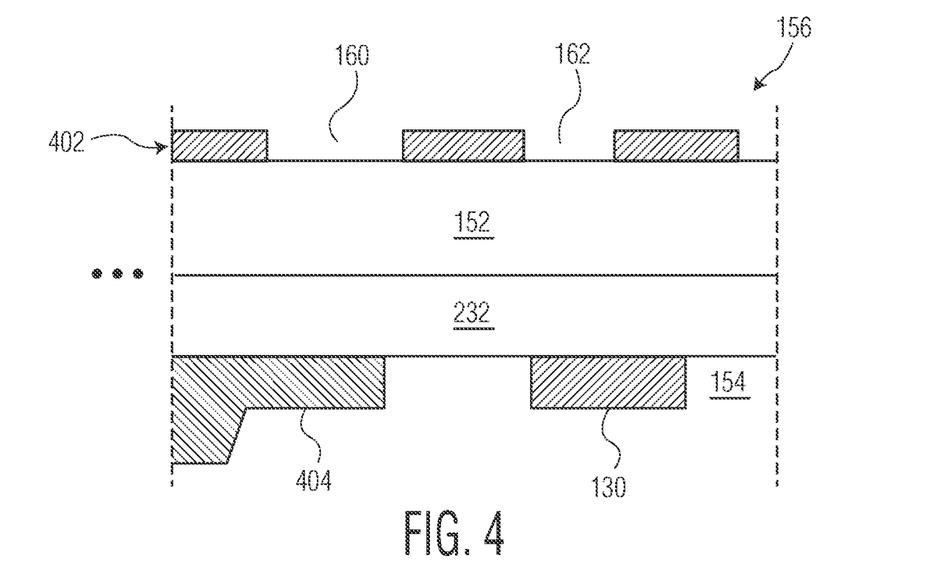
FIGS. 4 to 6 are example simplified cross section views of example fabrication steps for forming the example integrated circuit according to an embodiment.
Figure 5:
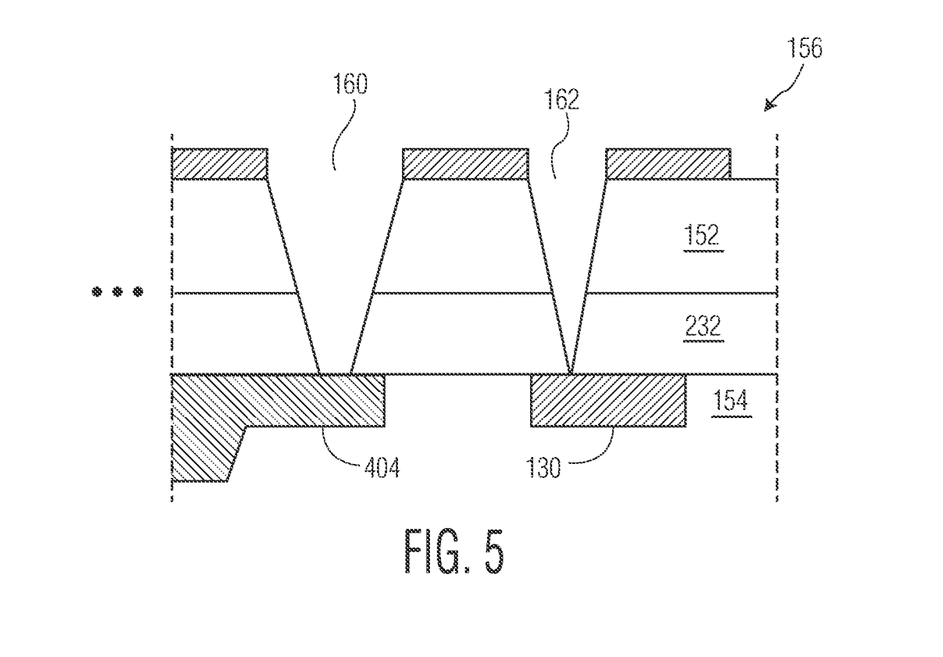
Figure 6:
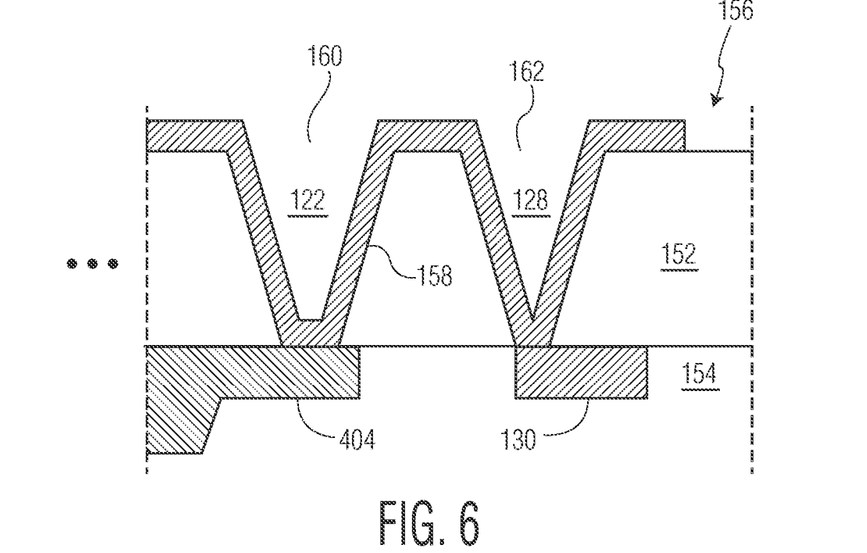

FIGS. 4, 5, and 6 are example simplified cross section views of example fabrication steps for forming the device accordance with steps 310 to 330 of FIG. 3 in accordance with an embodiment. The non-active region 236 of the substrate 152 is etched to form TSVs.

Referring now to FIG. 4, a mask 402 may be formed on the second surface 156 of the substrate 152, according to an embodiment. In an embodiment, the mask 402 is then patterned resulting in one or more openings shown as opening 160 and opening 162. The opening 162 may correspond to a non-standard TSV to be ideally etched in the substrate 152 and the opening 160 may correspond to a standard TSV to be ideally etched in the substrate 152. In example, the opening 162 may have a smaller area than the area of the opening 160. For completeness and as an example, the cross section views further show the insulating layer 232, the pad 130, and a metal interconnect 404 of the substrate 152 which may take the form of the second metal interconnect 224 or other metal interconnect to a semiconductor device or formed on an interposer.

Referring now to FIG. 5, the substrate 152 may be etched through the openings 160, 162 in the mask 402. For example, the substrate 152 may be etched by a plasma etch technique. Opening 162 may be smaller than opening 160 which results in the substrate 152 being etched at a slower rate compared to the opening 160. The substrate 152 may be etched through the openings 160, 162 from the second surface 156 and through the substrate 152 and insulating layer 232 to the pad 130 and second interconnect metal 224.

Referring now to FIG. 6, the mask 402 is removed, and a conductive material 158 may be arranged within an interior of the etched substrate at the TSVs 122, 128. In an example, interior surfaces may be lined with the conductive material or the TSVs 122, 128 are filled with the conductive material. In an embodiment, the conductive material may be selected from one of gold (Au), nickel (Ni), platinum (Pt), aluminum (Al), copper (Cu), titanium (Ti), silver (Ag), chromium, (Cr), or a combination of these. If an electrical path is formed from the first surface 154 to the second surface 156 by the conductive material, then a non-standard TSV 128 is properly formed and formation of the standard TSV 122 is validated. If an electrical path is not formed, then the non-standard TSV 128 is not properly formed and formation of the non-standard TSV 128 is not validated. Whether TSVs are formed in the substrate depends on whether the substrate is etched all the way through.

In embodiments, a size of an opening to form a standard TSV and a size of an opening to form a non-standard TSV may be determined empirically using a test substrate. The sizes of the openings may be chosen to maintain a desired margin between formation of the non-standard TSV and formation of the standard TSV so that proper formation of the standard TSV results.

Figure 7:
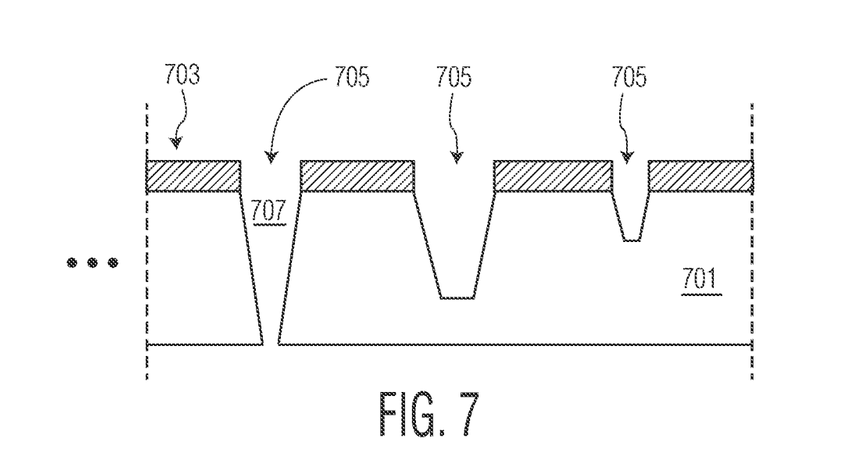
FIG. 7 is an example of a test substrate for determining sizes of openings to form the non-standard TSV and the standard TSV according to an embodiment.

FIG. 7 is an example of a test substrate 701 for determining sizes of openings to form the non-standard TSV and the standard TSV. A mask 703 may be formed on the test substrate 701 with a material similar to that described above, and the mask 703 may be patterned to include a plurality of openings 705 of different sizes. An etch rate through the substrate 701 may depend on a pattern of an opening where a smaller size opening will etch through the substrate 701 at a slower rate compared to a larger size opening. The test substrate 701 with the mask 703 may be etched for an etch duration using an etching process such as a plasma etching technique. The etch duration is based on a desired etch time of the standard size TSV which results in completion of the standard size TSV. Completion is indicated by a via which is formed through the substrate 701. In some examples, the etch time may run for an additional time beyond the completion such as 10% more time than needed for completion to ensure that the standard TSV is properly formed. Based on the etch duration, one or more TSVs 705 may be formed in the test substrate which are visually and/or electrically confirmed. A TSV 707 from the one or more TSVs 705 may be selected to be a non-standard TSV. The TSV 707 may be associated with a size of an opening in the mask which results in the TSV reaching completion. In some examples, the opening for the non-standard TSV 707 may be a circular via with a 30 um diameter to a via of 30×50 um$^2$ and the standard TSV may be elliptical with dimensions of 30×70 um$^2$. Because the standard TSV is formed through an opening larger than a size of an opening through which the non-standard TSV is formed, the standard TSV would be formed at a faster etch rate and be completed (i.e., formed all the way through the substrate) before the non-standard TSV with a given margin dictated by the difference in size of the openings. The margin may be a time difference between when the standard TSV is formed and when the non-standard TSV is formed. A larger margin indicates a higher probability that if the non-standard TSV is properly formed, the standard TSV is properly formed because the substrate is etched for a longer period of time.

Figure 8:
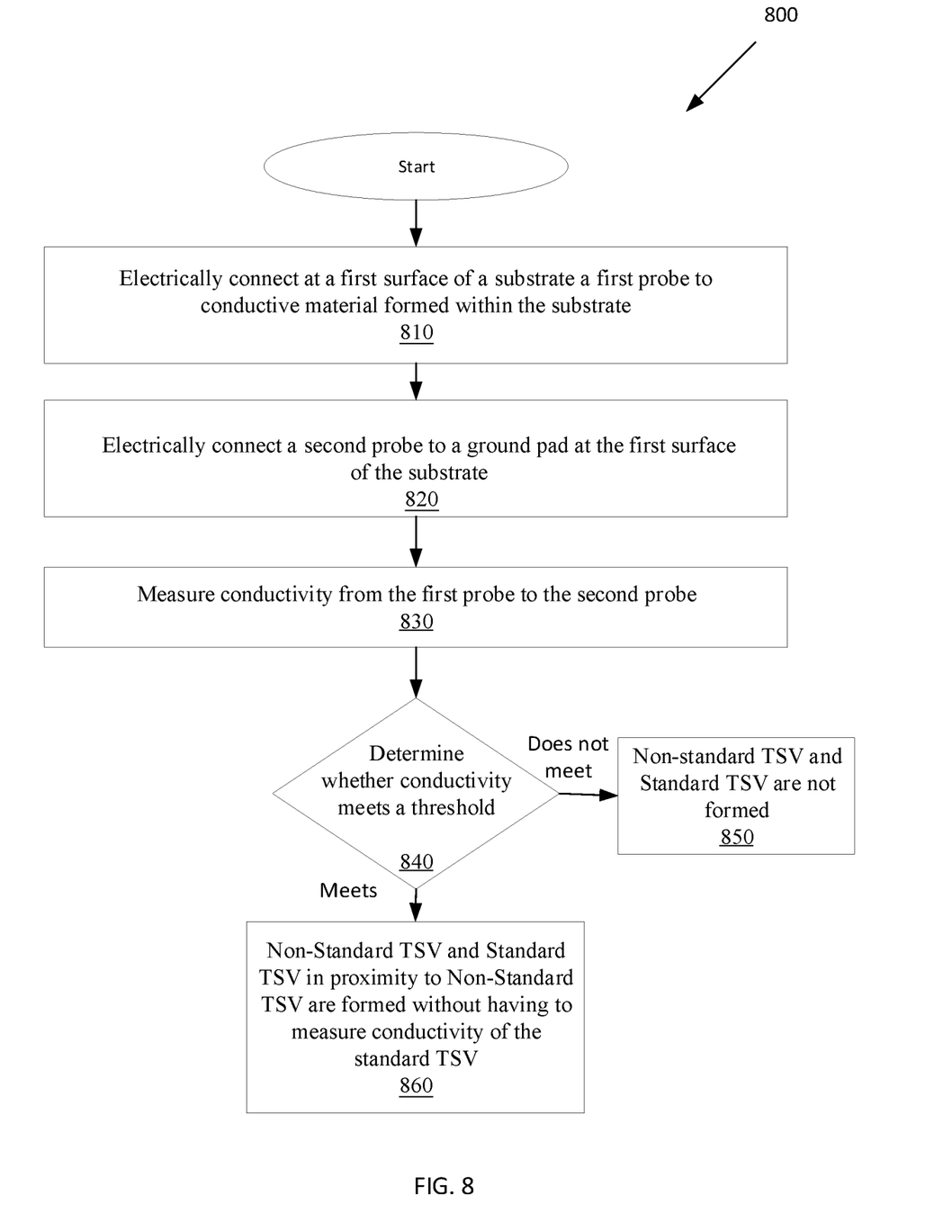
FIG. 8 is an example flow chart which illustrates an example method for validating formation of the standard TSV based on validating formation of the non-standard TSV according to an embodiment.

FIG. 8 is an example flow chart 800 which illustrates an example method for validating formation of the standard TSV based on validating formation of the non-standard TSV according to an embodiment. Referring to flow chart 800 and FIG. 1, at step 810, a first probe 168 is electrically connected at a first surface 154 of a substrate 152 to conductive material formed within the substrate 152. The conductive material may be formed as a result of etching the substrate at an opening of a mask to attempt to form a non-standard TSV followed by deposition of the conductive material in the etched substrate. In examples, the first probe 168 may be coupled to the pad 130 which is electrically coupled to the conductive material. At step 820, a second probe 170 is electrically connected to ground pad 132 at the first surface 154 of the substrate 152. In some examples, the ground pad 132 may form an electrical connection from the first surface 154 to the second surface 156. At step 830, a conductivity is measured from the first probe 168 to the second probe 170. At step 840, a determination is made whether the conductivity meets a threshold amount. If the conductivity meets the threshold amount, then a non-standard TSV 128 and standard TSV in proximity to the non-standard TSV 128 are formed at 860 without having to test the standard TSV. In an example, the conductivity may indicate an electrical connection from the first probe 168, through the conductive material in the non-standard TSV 128 properly formed to the second surface 156, then through a standard TSV properly formed to the ground pad 132. If the conductivity does not meet the threshold amount, then a non-standard TSV is not formed and formation of a standard TSV in proximity to the non-standard TSV is not validated at 850. The conductivity may be characterized by one or more of a resistance or a current. In the case of a current, a voltage 166 may be applied to the conductive material and the current measured.

In one embodiment, an integrated circuit is disclosed. The integrated circuit comprises: a substrate that includes a first surface and a second surface; a first through substrate via (TSV) formed between the first surface and the second surface; a first conductive material arranged within the first TSV to form a conductive path between the first surface and the second surface through the substrate; a second TSV formed between the first surface and the second surface; a second conductive material arranged within the second TSV to form a conductive path between the first surface and the second surface through the substrate; and wherein the first TSV has a larger cross-sectional area than a cross-sectional area of the second TSV, the cross-section of the first TSV and second TSV being in a plane parallel to the first surface or the second surface. In an embodiment, the second TSV is located at a periphery of the substrate. In an embodiment, the integrated circuit comprises a plurality of the first TSVs, each first TSV having a substantially same aspect ratio of cross-sectional area to depth and which is substantially different from an aspect ratio associated with the second TSV. In an embodiment, the substrate further comprises a semiconductor device coupled to the first conductive material. In an embodiment, the integrated circuit further comprises a third TSV with a same cross-sectional area as the first TSV, the third TSV formed between the first surface and the second surface and having a third conductive material formed within the third TSV to form a conductive path between the first surface and the second surface through the substrate, the semiconductor device coupled to the third conductive material. In an embodiment, the first surface is at a ground potential. In an embodiment, the first conductive material of the first TSV is not electrically connected to the second conductive material of the second TSV by an interconnect on the second surface.

In another embodiment, a method is disclosed. The method comprises: applying a mask to a first surface of a substrate that includes a second surface, and patterning the mask to have a first opening and a second opening; etching the substrate through the first opening and the second opening for a same etching time to form a first via and a second via; forming a first conductive material on an interior of the etched substrate within the first via to form a conductive path between the first surface and the second surface; and forming a second conductive material on an interior of the etched substrate within the second via to form a conductive path from the first surface to the second surface; wherein the first opening is larger than the second opening. In an embodiment, an etch rate of the substrate through the first opening is greater than an etch rate of the substrate through the second opening and an etch time is based on completing the etch through the substrate at the second opening with a given margin for completing the etch though the substrate at the first opening. In an embodiment, the method further comprises forming a semiconductor device on the substrate which is coupled to the first conductive material. In an embodiment, patterning the mask comprises forming a third opening in the mask, and etching the substrate includes etching the substrate through the third opening to form a third via, and wherein the method further comprises forming a third conductive material within the third via to form a conductive path between the first surface and the second surface, the third conductive material electrically connected to the semiconductor device. In an embodiment, the first conductive material is not electrically connected to the second conductive material by an interconnect on the second surface. In an embodiment, the second opening is located at a periphery of the substrate. In an embodiment, the method further comprises forming on another substrate a test mask with a plurality of openings of different sizes, etching the other substrate using the test mask; and based on the etching, selecting a size of the second opening which forms a TSV in an etch time based on the etching of the other substrate.

In yet another embodiment, a method of testing formation of a through substrate via (TSV) in a substrate is disclosed. The method comprises: electrically connecting at a first surface of the substrate a first probe to a conductive material formed within an interior of the substrate; electrically connecting at the first surface of the substrate a second probe to a ground pad which electrically couples the first surface to a second surface of the substrate; determining that a conductivity from the first probe to the second probe exceeds a threshold level, the conductivity indicating that a first TSV is properly formed with the conductive material; and determining that a plurality of second TSVs are properly formed TSVs, the determination being made without measuring a conductivity of the plurality of second TSVs and wherein a cross-sectional area of the first TSV is smaller than cross-sectional areas of the plurality of second TSVs, the cross-sections of the first TSV and second TSVs being in a plane parallel to the first surface or the second surface. In an embodiment, the first TSV is not electrically connected to the second TSV by an interconnect on the first surface. In an embodiment, determining that the conductivity exceeds the threshold level comprises detecting that a current from the first probe to the second probe exceeds the threshold level. In an embodiment, the method further comprises applying a voltage to the conductive material and detecting current between the probes resulting from the applied voltage. In an embodiment, determining that the conductivity exceeds the threshold level comprises detecting a resistance between the first probe and the second probe. In an embodiment, determining that the plurality of the second TSVs are properly formed TSVs comprises identifying that the plurality of the second TSVs and the first TSV were formed by etching the substrate for a same period of time.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method comprising:
applying a mask to a first surface of a substrate that includes a second surface, and patterning the mask to have a first opening and a second opening;
etching the substrate through the first opening and the second opening for a same etching time to form a first via and a second via respectively;
forming a first conductive material on an interior of the etched substrate within the first via to form a conductive path between the first surface and the second surface; and
forming a second conductive material on an interior of the etched substrate within the second via to form a conductive path from the first surface to the second surface;
wherein the first opening is larger than the second opening;
wherein a cross sectional area of the first via is elliptical in shape based on a cross section of the first via parallel to the first surface and a cross sectional area of the second via is circular in shape based on a cross section of the second via parallel to the first surface.

2. The method of claim 1, wherein an etch rate of the substrate through the first opening is greater than an etch rate of the substrate through the second opening and an etch time is based on completing the etch through the substrate at the second opening with a given margin for completing the etch though the substrate at the first opening.

3. The method of claim 1, further comprising forming a semiconductor device on the substrate which is coupled to the first conductive material.

4. The method of claim 3, wherein patterning the mask comprises forming a third opening in the mask, and etching the substrate includes etching the substrate through the third opening to form a third via, and wherein the method further comprises forming a third conductive material within the third via to form a conductive path between the first surface and the second surface, the third conductive material electrically connected to the semiconductor device.

5. The method of claim 1, wherein the first conductive material is not electrically connected to the second conductive material by an interconnect on the second surface.

6. The method of claim 1, wherein the second opening is located at a periphery of the substrate.

7. The method of claim 1, further comprising forming on another substrate a test mask with a plurality of openings of different sizes, etching the other substrate using the test mask; and based on the etching, selecting a size of the second opening which forms a TSV in an etch time based on the etching of the other substrate.

* * * * *